United States Patent [19]
Schmidt

[11] 3,762,288
[45] Oct. 2, 1973

[54] EXPOSURE CONTROL TIMING CIRCUIT

[75] Inventor: Peter Schmidt, Stuttgart-Wangen, Germany

[73] Assignee: Eastman Kodak Company, Rochester, N.Y.

[22] Filed: Mar. 3, 1972

[21] Appl. No.: 231,488

[52] U.S. Cl. .............................. 95/10 CT, 95/53 EB
[51] Int. Cl. .............................................. G03b 7/08
[58] Field of Search ..................... 95/10 CT, 53 EA, 95/53 EB

[56] References Cited

UNITED STATES PATENTS

| | | | |
|---|---|---|---|
| 3,324,779 | 6/1967 | Nobusawa et al. | 95/10 |
| 3,633,473 | 1/1972 | Yashuhiro | 95/10 |
| 3,678,825 | 7/1972 | Nobusawa | 95/10 |
| 3,651,744 | 3/1972 | Okada | 95/10 |
| 3,504,611 | 4/1970 | Richter et al. | 95/53 X |

*Primary Examiner*—Samuel S. Matthews
*Assistant Examiner*—Michael L. Gellner
*Attorney*—W. H. J. Kline et al.

[57] ABSTRACT

An electronic timing circuit for use in camera exposure control includes a multivibrator circuit operable in a first stable state upon coupling a potential source in circuit therewith, and activatable to a second stable state. A first trigger circuit is coupled in circuit with the multivibrator circuit to be momentarily triggered into conduction when the multivibrator circuit is activated to its second stable state. A timing circuit is coupled to the first trigger circuit, and includes a photosensitive element having a parameter variable as scene light varies and a capacitor. The timing circuit is connectable in series circuit with the potential source so that the capacitor charges through the photosensitive element when the multivibrator circuit is in its first stable state and is momentarily discharged through the trigger circuit when the multivibrator circuit changes to its second stable state. The capacitor recharges through the photosensitive means to a predetermined potential level in a time interval related to the value of the parameter. A second trigger circuit is responsive to the potential charge on the capacitor when the potential reaches the predetermined level.

1 Claim, 5 Drawing Figures

EXPOSURE CONTROL TIMING CIRCUIT

BACKGROUND OF THE INVENTION

1. Field of the Invention

This invention relates to electronic timing circuitry for camera exposure control and more particularly to electronic circuitry providing isolation of the timing means from timing inaccuracy due to switch bounce.

2. Description of the Prior Art

Cameras are known which include electronic timing circuitry utilizing a photosensitive element and the capacitor as a means for establishing a time interval for exposure which is related to the intensity of scene light. These timing circuits in general depend upon switching the capacitor into series circuit with the photosensitive element upon initiation of the exposure interval. Mechanical switches are often used in the electronic circuit and normally comprise contact springs which tend to chatter or bounce when the switches are actuated. As a result, the effective contact-making is rendered irregular and the electronic timing becomes inaccurate so that the precise operation during exposure is substantially impaired.

SUMMARY OF THE INVENTION

Therefore, it is an object of this invention to provide an improved electronic timing circuit for use in camera exposure control.

It is another object of the present invention to provide an electronic timing circuit for use in cameras which is not subject to timing instability due to bounce of timing circuit switches.

It is still another object of the present invention to provide an electronic timing device for cameras which provides isolation of the timing device from possible timing switch bounce.

These and other objects are achieved according to one illustrative embodiment of the invention by an exposure control electronic timing circuit which includes a multivibrator circuit responsive to the coupling of a potential source in circuit therewith for providing operation in a first stable state and being activatable to a second stable state. The electronic circuit includes timing means comprising a photosensitive element which has a parameter variable as scene light varies and a capacitor. The timing circuit means are connectable in series circuit with the potential source so that the capacitor is chargeable through the photosensitive element and reaches a predetermined level after a period of time related to the value of the parameter. Means couple the multivibrator circuit to a junction between the photosensitive element and the capacitor, the means affecting the charging of the capacitor through the photosensitive element when the multivibrator is triggered to its second stable state. Circuit means, including transducer means are responsive to the charge on the capacitor when the potential charge reaches the predetermined level.

It is a feature of my invention that the electronic circuit provides isolation of the timing circuit means from switch noise upon actuation of the electronic circuit.

BRIEF DESCRIPTION OF THE DRAWINGS

In the preferred embodiment of the invention, reference is made to the accompanying drawings in which.

DETAILED DESCRIPTION OF THE DRAWINGS

Figure 1:
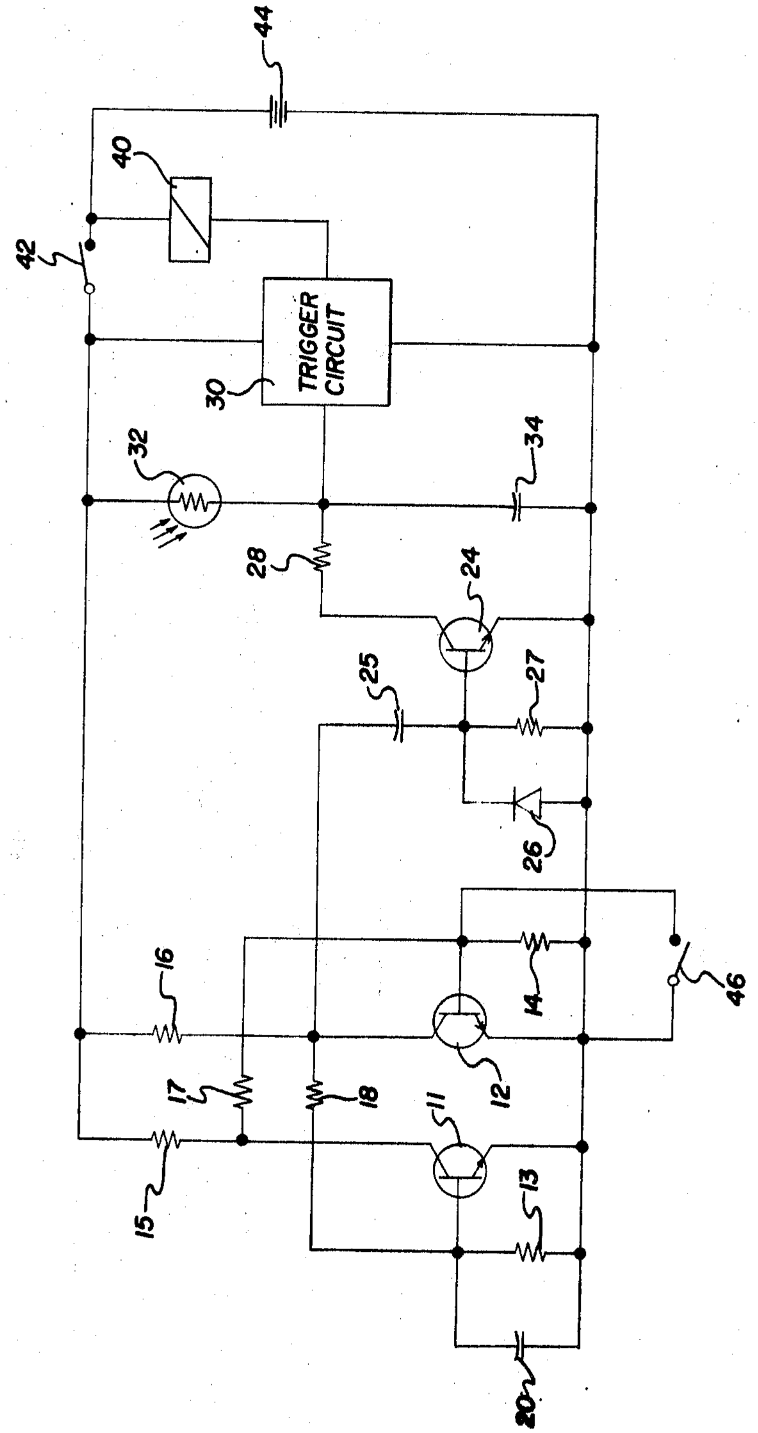
FIG. 1 is a schematic diagram of an electronic circuit according to the present invention.

Referring to the accompanying drawings and in particular to FIG. 1, there is schematically shown an electronic circuit according to one illustrative embodiment of the invention which includes a first transistor 11 and a second transistor 12 which are coupled in the form of a bistable multivibrator circuit. The base of transistors 11 and 12 are coupled to a negative potential source 44 through resistors 13 and 14 respectively, and the emitters of the transistors 11 and 12 are coupled in common to the negative potential source 44. The collectors of the transistors 11 and 12 are coupled to the positive potential source 44 through resistors 15 and 16 respectively. The base of transistor 11 is coupled to the collector of the transistor 12 through a resistor 18, and the base of the transistor 12 is coupled to the collector of the transistor 11 through a resistor 17. Through the use of a capacitor 20 and the resistors 13–18, the multivibrator is initially at rest upon application of the potential source 44, with the transistor 11 cutoff and the transistor 12 conducting; a state in which it will remain until activated to its second stable state having the transistor 12 cutoff and the transistor 11 conducting.

A first trigger circuit which may for example comprise a transistor 24, a diode 26, and resistors 27 and 28, is coupled in circuit with the multivibrator through a coupling capacitor 25, between the base of the transistor 24 and the collector of the transistor 12. A second trigger circuit 30 which may be of conventional design in the art, such as for example the well known Schmitt Trigger, is shown in block form coupled through a resistor 28 to the collector of transistor 24. It is understood that various forms of trigger circuits may be substituted within the scope of this invention and that the term trigger circuit is used for clarity of description to distinguish between a multivibrator, which may be called a trigger circuit, and the remaining trigger circuit forms used herein. A transducer 40 such as, for example, an electromagnet or the like is coupled in circuit with, and energizable by output current of the second trigger circuit 30 during its conductive state. The transducer 40 may be used for controlling the opening or closing operation conventional shutter means in a camera.

A photosensitive element 32 and a capacitor 34 are coupled in the electronic circuit between the first and second trigger circuits. The photosensitive element 32 may be for example a cadmium sulfide photocell or the like, and may be referred to herein as a photocell 32, whose resistance varies inversely with, or whose conductance is proportional to the intensity variations in the scene light. The photocell 32 may be conveniently placed in the camera for receiving scene light from a subject to be photographed. The capacitor 34 is coupled through the photocell 32 to the potential source 44 via a switch 42. A junction between the photocell 32 and the capacitor 34 is coupled to the collector of the transistor 24 and is also connected to the input of the trigger circuit 30. A potential charge on the capacitor 34 received from the potential source 44 via the switch 42 and photocell 32 furnishes a threshold potential for biasing the second trigger circuit 30 between its conductive or nonconductive state.

The switch 42, upon closure, couples the potential source 44 in circuit. A second switch 46 connected between the emitter and base elements of the transistor 12, upon closure, provides bias to switch the transistor 12 from conduction into cutoff. The switches 42 and 46 may be coupled together to provide sequential actuation of each at a time that accounts for mechanical delay in conventional camera exposure control apparatus. As may be seen by reference to FIG. 2, the time $t=0$ represents the camera actuation and the time $t=t_1$ represents the shutter open or start time. The time $t=t_1$ may for example be the closure of the switch 46 to switch the transistor 12 into cutoff.

Figure 2:
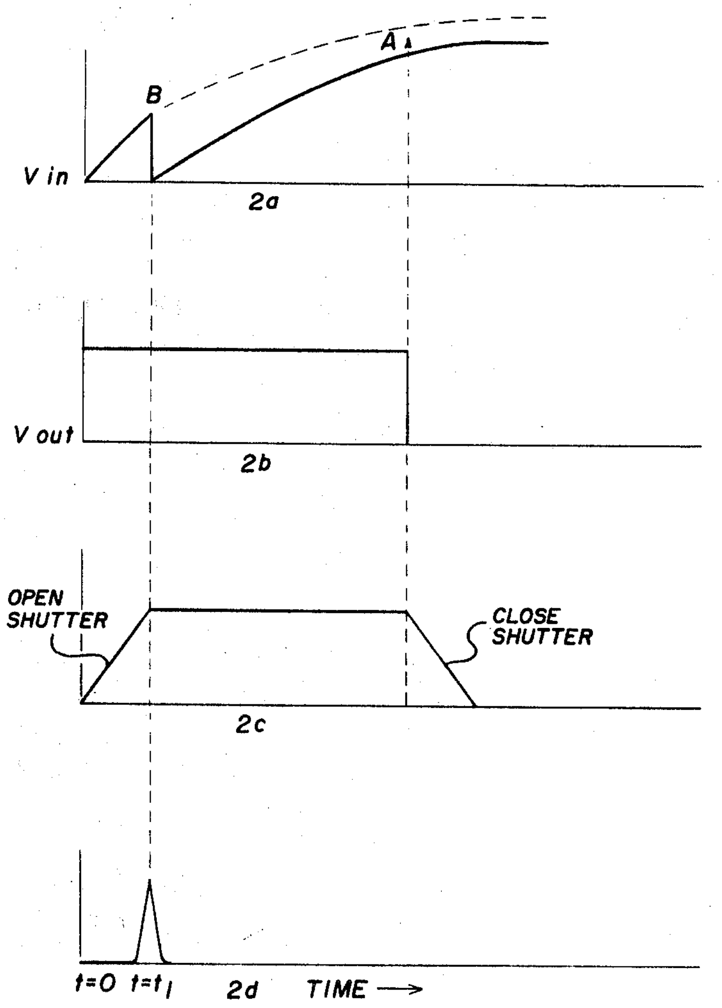
FIGS. 2*a*, 2*b*, 2*c*, and 2*d* described a time relationship between the sequence of events beginning with the actuation of the camera and ending with the closing of the shutter means.

When a camera incorporating such a timing circuit is actuated to provide photographic exposure, the switch 42 is closed supplying potential to the electronic circuit. At this time, $t=0$ of FIG. 2, the state of the electronic circuit is as follows: the transistor 24 is cutoff; the trigger circuit 30 is conducting and the transducer 40 is energized; the multivibrator is initially in the first stable state with the transistor 12 forward biased into conduction and the transistor 11 cutoff; the transistor 24 is biased into cutoff; and the capacitor 34 begins to charge through the photocell 32 to a potential charge which approaches the potential of potential source 44, as shown by FIG. 2*a*. The capacitor 34, being coupled to the input circuit of the trigger circuit 30 provides a threshold potential (Vin of FIG. 2*b*) which will bias the second trigger circuit 30 into a nonconductive state when the potential charge on the capacitor 34 reaches the point A.

The closure of the switch 46 is approximately simultaneous with closure of the switch 42 and with the opening of the shutter means which operate to admit light into the camera at the time $t=t_1$ of FIG. 2d. Upon closure the switch 46, the transistor 12 is biased into cutoff. As the transistor 12 becomes nonconducting, the transistor 11 becomes conducting by means of the conventional operation of the multivibrator circuit, and the potential at the collector of the transistor 12 rises sharply. The sharp potential rise at the collector is transferred through the capacitor 25 as a positive pulse (shown in FIG. 2*d*) to the base of the transistor 24 which momentarily produces a forward bias and produces a temporary conductive state in the transistor 24. The capacitor 34 discharges through the resistor 28 and the low conductive resistance of transistor 24; the discharge of the capacitor 34 being rapid as shown in FIG. 2*a*. This time interval should be sufficient to discharge the capacitor 34 to approximately ground potential. After the positive pulse passes, the transistor 24 is again biased into cutoff, and as further shown in FIG. 2 *a*, the capacitor 34 again begins to charge through the photocell 32. The capacitor-photocell configuration referred to is essentially an integrator circuit which normally responds to the application of a step input by producing an output which changes with time in a manner functionally dependent upon the resistance of the photocell 32. If the conductance ($1$/Resistance of photocell) of the photocell 32 is proportional to the light intensity, the potential charge on the capacitor 34 at any instant subsequent to the application of the step input is a measure of the value of the time-integral of the light incident on the photocell 32 at that instant. To a first approximation, then, the potential charge on the capacitor will reach its predetermined level when the amount of light incident on the photocell 32 has some predetermined value regardless of the time variation of the scene light. At this predetermined charge the trigger circuit 30 is triggered into nonconduction and the transducer 40 is de-energized as current flow from the trigger circuit 30 terminates. The shutter means are accordingly closed as the transducer 40 de-energizes.

The invention has been described in detail with particular reference to preferred embodiments thereof, but it will be understood that variations and modifications can be effected within the spirit and scope of the invention.

I claim:

1. An electronic timing circuit for use in a camera for providing a time interval of exposure which is related to the intensity of available light, comprising:

means for applying a potential to said electronic timing circuit;

a multivibrator circuit, operable in a first stable state upon application of said potential to said electronic timing circuit, said multivibrator circuit having a second stable state;

means for changing said multivibrator to its second stable state;

first trigger circuit means coupled in circuit with said multivibrator, said first trigger circuit means being normally in a nonconducting state;

means for coupling said first trigger circuit means to said multivibrator for momentarily changing said first trigger circuit means to a conducting state upon changing of said multivibrator to its second stable state;

timing circuit means including photosensitive means, disposed to receive available light and having a parameter variable as the light intensity varies, and a capacitor coupled in series circuit therewith forming a junction therebetween, said capacitor and photosensitive element connectable in series circuit with an applied potential for charging said capacitor;

circuit means, coupling said first trigger circuit means and said junction, for providing a discharge path for said capacitor when said first trigger circuit means is momentarily changed to a conducting state so that said capacitor is discharged through said first trigger circuit means and said capacitor begins to recharge through said photosensitive means for a time interval related to the value of said parameter;

second trigger circuit means having an input coupled in circuit with said junction of said timing circuit means and an output related to said charge upon said capacitor; and transducer means coupled to said second trigger circuit and energizable or de-energizable by said output of said second trigger circuit means.

* * * * *